United States Patent [19]

Moriizumi et al.

[11] Patent Number: 4,949,219
[45] Date of Patent: Aug. 14, 1990

[54] MODULE SEALING STRUCTURE

[75] Inventors: Kiyokazu Moriizumi, Kawasaki; Kyoichiro Kawano, Yokohama; Kiyotaka Seyama, Kawasaki, all of Japan

[73] Assignee: Fujitsu Limited, Kawasaki, Japan

[21] Appl. No.: 356,245

[22] Filed: May 24, 1989

[30] Foreign Application Priority Data

May 24, 1988 [JP] Japan .................................. 63-125023

[51] Int. Cl.⁵ .............................................. H05K 7/20
[52] U.S. Cl. .................................... 361/386; 165/80.4; 165/185; 174/16.3; 357/81; 357/82; 361/382; 361/385
[58] Field of Search ........................ 174/16.3; 165/80.4, 165/185; 357/81, 82; 361/381, 382, 385–389

[56] References Cited

U.S. PATENT DOCUMENTS 4,561,011 12/1985 Kohara et al. ..................... 361/386
4,833,567 5/1989 Saaski et al. ....................... 361/385

Primary Examiner—Gregory D. Thompson
Attorney, Agent, or Firm—Staas & Halsey

[57] ABSTRACT

A sealed module includes a cold plate having a passage through which a cooling medium flows, a plurality of bellows structures having first ends which communicate with the passage in the cold plate to form a thermal conduction type cooling system and a plated printed circuit having a substrate and a plurality of integrated circuit elements provided on a first surface the substrate. The integrated circuit elements are in contact with ends of the bellows structures. A metal fitting secured on the cold plate has a flange disposed beneath the other surface of the substrate to present a junction between the second surface of the substrate and the flange of the metal fitting. A polyimide layer is formed on the surface of the substrate and a conductor layer is formed on the polyimide layer. The polyimide layer and the conductor layer are approximately ring shaped at least at the peripheral portions of the substrate. The flange of the metal fitting is fixed to the substrate by solder provided between the conductor layer and the flange, to thereby provide a seal between the substrate and the flange.

10 Claims, 4 Drawing Sheets

MODULE SEALING STRUCTURE

BACKGROUND OF THE INVENTION

The present invention generally relates to structure for sealing module, and more particularly to a structure for sealing modules which include a plurality of plated printed circuits provided with a thermal conduction type cooling system.

The plated printed circuitry of modern electronic apparatus such as computers generates a large quantity of heat because a large number of integrated circuit elements are provided on a multi-layer ceramic substrate at a high density and the circuits are operated at a high speed. Accordingly, the plated printed circuitry must be effectively cooled in order to ensure stable operation of the circuits. Usually, thermal conduction type cooling systems are employed in which each of the integrated circuit elements is directly cooled using a cooling medium having a large cooling effect.

In thermal conduction type cooling systems, a cold plate having a passage through which a cooling medium flows and a bellows which communicates with the passage are arranged immediately above the integrated circuit elements at the surface of the plated printed circuit and the ambient atmosphere becomes highly humid. For this reason, a sealed space is provided between the cold plate and the plated printed circuit and a gas such as nitrogen or helium is provided within the space at a predetermined pressure so as to maintain a dry atmosphere. Such sealed structure prevents the corrosion of the integrated circuit elements, the circuit patterns and the bonding material, and the reliability of the plated printed circuit is enhanced and deterioration is prevented.

FIG. 1 shows an example of a conventional sealed module including conventional sealing structure, and FIG. 2 shows an essential part of the conventional module sealing structure on an enlarged scale. In FIG. 1, the module includes a plated printed circuit 1 comprising a multi-layer ceramic substrate 2 having a top surface 2a and a bottom surface 2b. A large number of integrated circuit elements 3 are provided on the top surface 2a of the substrate 2, and input/output pins 4 project from the bottom surface 2b of the substrate 2. A thermal conduction type cooling system 5 includes a box shaped cold plate 6 which opens to the bottom. A passage 7 for the cooling medium is provided inside the cold plate 6, and bellows structures 8 communicate with the passage 7. The cold plate 6 is arranged so that a bottom plate portion 9 of each of the bellows structure 8 make close adherence with the corresponding integrated circuit element 3 of the plated printed circuit 1, and a generally ring-shaped metal fitting 10 is mounted at the bottom of the cold plate 6. A flange 10a of the metal fitting 10 projects inwardly thereto and holds the peripheral portion 2c of the bottom surface 2b of the substrate 2. A module 11 is completed in this manner.

The sealing between the bottom surface 2b of the substrate 2 and the flange 10a of the metal fitting 10 is made as shown in FIG. 2. That is, a thin metal film 12 is formed on the peripheral portion of the bottom surface 2b of the substrate 2, and this thin metal film 12 and the flange 10a are fixed together by a solder 13 to provide the sealing between the bottom surface 2b of the substrate 2 and the flange 10a of the metal fitting 10. As a result, a sealed space 14 is formed between the cold plate 6 and the plated printed circuit 1, and a gas such as nitrogen is sealed within the space 14.

Therefore, the integrated circuit elements 3, the circuit patterns on the substrate 2 and the other components on substrate 2 are maintained in a dry atmosphere by the gas sealed within the space 14, and the heat generated from the integrated circuit elements 3 is reduced and eliminated by the cooling medium in the bellows structures 8.

In the conventional module the sealing structure, is formed by directly fixing the flange 10a to the thin metal layer 12 which is formed on the peripheral portion 2c of the bottom surface 2b of the substrate 2 by the solder 13. For this reason, a pushing force exerted by the bellows structures 8 acts directly on the junction between the peripheral portion 2c of the substrate 2 and the flange 10a. In addition, thermal stress is generated at the junction due to differences in the coefficients of thermal expansion of the materials used at the junction, but there is no means for absorbing such thermal stress. As a result, damage such as cracking easily occurs at the junction, and the substrate 2 is easily damaged because it is usually made of a glass ceramic material or the like which is mechanically weak.

SUMMARY OF THE INVENTION

Accordingly, it is a general object of the present invention to provide a novel and useful structure for sealing modules in which the problems described above are eliminated.

Another and more specific object of the present invention is to provide a sealed module which comprises a cold plate having a passage through which a cooling medium flows, a bellows structure having a first end which communicates with the passage in the cold plate to form a thermal conduction type cooling system, a plated printed circuit having a substrate and an integrated circuit element provided on a first surface of the substrate, the integrated circuit element being in contact with a second end of the bellows structure, and a metal fitting secured on the cold plate and having a flange disposed beneath a second surface of the substrate to present a junction between the second surface of the substrate and the flange of the metal fitting. A polyimide layer is formed on the second surface of the substrate and a conductor layer is formed on the polyimide layer. The polyimide layer and the conductor layer are respectively formed approximately in the shape of rings at least at the peripheral portion of the second surface of the substrate. The flange of the metal fitting is fixed to the substrate by solder provided between the conductor layer and the flange, to thereby provide a seal between the substrate and the flange. According to the module sealing structure of the present invention, the excessive forces acting on the substrate from the bellows structure and the thermal stresses generated at the junction are absorbed by the polyimide layer. As a result, it is possible to prevent damage at the junction and to the substrate itself, and provide a positive seal between the substrate and the metal fitting.

Other objects and further features of the present invention will be apparent from the following detailed description when read in conjunction with the accompanying drawings.

DESCRIPTION OF THE PREFERRED EMBODIMENTS

Figure 2:
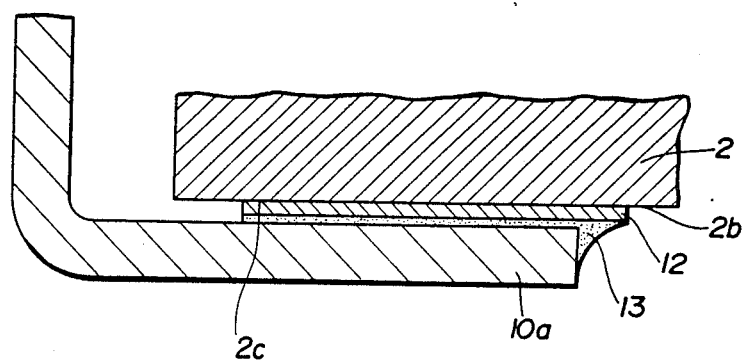
FIG. 2 is a cross sectional view showing the essential parts of the conventional module sealing structure of FIG. 1.
Figure 3:
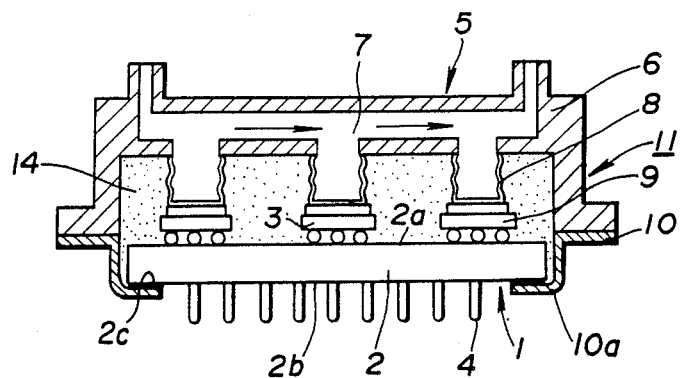
FIG. 3 is a cross sectional view generally showing an embodiment of a module sealed using the sealing structure according to the present invention.
Figure 4:
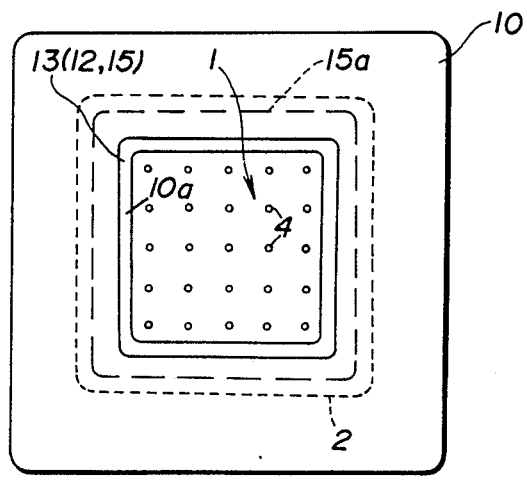
FIG. 4 is a bottom view of the embodiment of FIG. 3.
Figure 5:
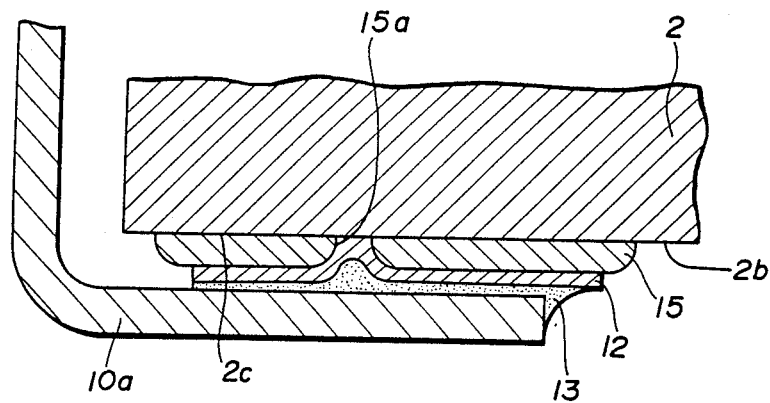
FIG. 5 is an enlarged side view showing an essential part of the embodiment of FIG. 3.

FIGS. 3 and 4 respectively show an embodiment of a module that has been sealed using sealing structure according to the present invention in vertical cross section and botton plan views, and FIG. 5 shows an essential part of the embodiment in cross section on an enlarged scale. In FIGS. 3 through 5, the parts which are substantially the same as those corresponding parts of the structure of FIGS. 1 and 2 are designated by the same reference numerals, and description thereof has been omitted.

Figure 1:
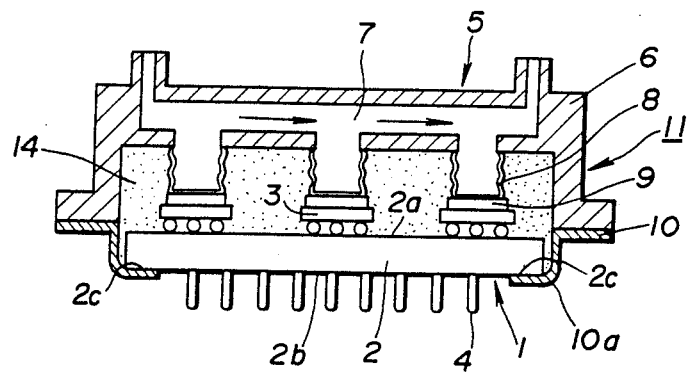
FIG. 1 is a cross sectional view generally showing an example of conventional module sealing structure.

In FIGS. 3 through 5, the plated printed circuit 1 and the thermal conduction type cooling system 5 are identical to the corresponding components shown in FIGS. 1 and 2 and described above. However, in this embodiment, the junction between the peripheral portion 2c of the bottom surface 2b of the substrate 2 and the flange 10a of the generally rectangular ring-shaped metal fitting 10 is different from that shown in FIGS. 1 and 2. As may be seen from FIG. 5, a ringshaped polyimide layer 15 is formed on the peripheral portion 2c of the bottom surface 2b of the substrate 2, and a ring-shaped thin metal film 12 is formed on the polyimide layer 15. An approximate ring-shaped groove 15a is formed in the polyimide layer 15 and the thin metal layer film 12 is also formed within the groove 15a so as to make contact with the bottom surface 2b of the substrate 2. The seal is completed by fixing the flange 10a to the thin metal film 12 using solder 13.

The thin metal film 12 is strongly adhered to the polyimide layer 15 at the bottom surface of the substrate 2, and for this reason, the substrate 2 strongly adheres on the flange 10a of the metal fitting 10. On the other hand, the polyimide layer 15 is resilient. Hence, the pushing force exerted by the bellows structure 8 can be distributed over aproximately the entire polyimide layer 15 due to the deformation of the polyimide layer 15. Furthermore, the thermal stress generated at the junction is similarly absorbed by deformation of the polyimide layer 15. Therefore, no excess force acts on the substrate 2 and it is possible to prevent damage at both the junction and to the substrate 2 itself.

The polyimide layer 15 absorbs moisture but external moisture is prevented from reaching the top surface 2a of the substrate 2 by the thin metal film 12 which is formed on the polyimide layer 15 and inside the groove 15a. Hence, the top surface 2a of the substrate 2 is positively maintained in a dry condition.

Figure 6A:
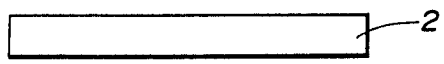
FIGS. 6A through 6E are cross sectional views of the embodiment of FIG. 3 at different production stages thereof.
Figure 6B:
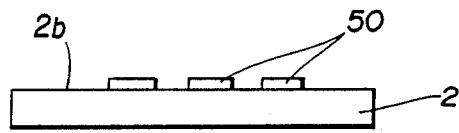
Figure 6C:
Figure 6D:
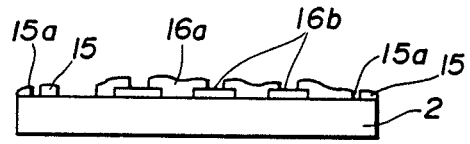
Figure 6E:
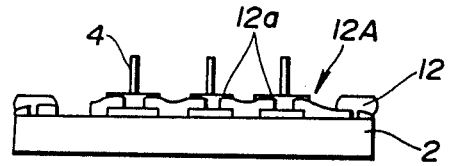

The method of producing the module sealing structure shown in FIGS. 3 through 5, is described with reference to FIGS. 6A through 6E. The substrate 2 shown in FIG. 6A is a multi-layer ceramic substrate, and conductive circuit patterns 50 are formed on the bottom surface 2b of the substrate 2 by a known process as shown in FIG. 6B. Then, a photosensitive polyimide layer 16 is formed on the bottom surface 2b of the substrate 2 to an approximately uniform thickness as shown in FIG. 6C using a known spin-coating process for use as an insulator layer, and the photosensitive polyimide layer 16 is patterned by a known exposure and developing process to thereby form an insulating layer 16a, the ring-shaped layer 15, the grooves 15a and holes 16b, as shown in FIG. 6D. Insulating layer 16a and ring-shaped layer 15 thus are of the same polyimide material. Such known exposure and developing process hardens only the exposed portions of the photosensitive polyimide layer 16. Finally, a conductor pattern layer 12A including the thin metal film 12 and input/output patterns 12a are simultaneously formed form the same metal on the remaining polyimide layer 16 by a known patterning process, and the input/output pins 4 are formed on the input/output patterns 12a. The groove 15a and the holes 166 may be formed by an etching process, and the conductor pattern layer 12A may be formed uniformly by a sputtering process.

The metal fitting 10 is secured on the cold plate 6 by screws (not shown), for example. In this case, an O-ring (not shown) is provided between the metal fitting 10 and the cold plate 6. The flange 10a of the metal fitting 10 is fixed on the thin metal film 12 of the plated printed circuit 1 shown in FIG. 6E by the solder 13.

The conventional structure shown in FIG. 2 has been compared with the structure of the embodiment shown in FIG. 5 for strength at the junction between the flange 10a of the metal fitting 10 and the bottom surface 2b of the substrate 2, and tests have shown that the strength of the junction obtainable by the structure shown in FIG. 5 is approximately two times that obtainable by the conventional structure shown in FIG. 2. For example, in a case where the area of adhesion at the junction is approximately 100 mm×100 mm and the pull strength along a direction perpendicular to the area of adhesion is approximately 2 mm/min, the maximum strength of the junction constituted by the substrate 2, the thin metal film 12, the solder 13 and the flange 10a shown in FIG. 2 is approximately 55 kg while the maximum strength of the junction constituted by the substrate 2, the polyimide layer 15, the thin metal film 12, the solder 13 and the flange 10a shown in FIG. 5 is approximately 110 kg.

Figure 7:
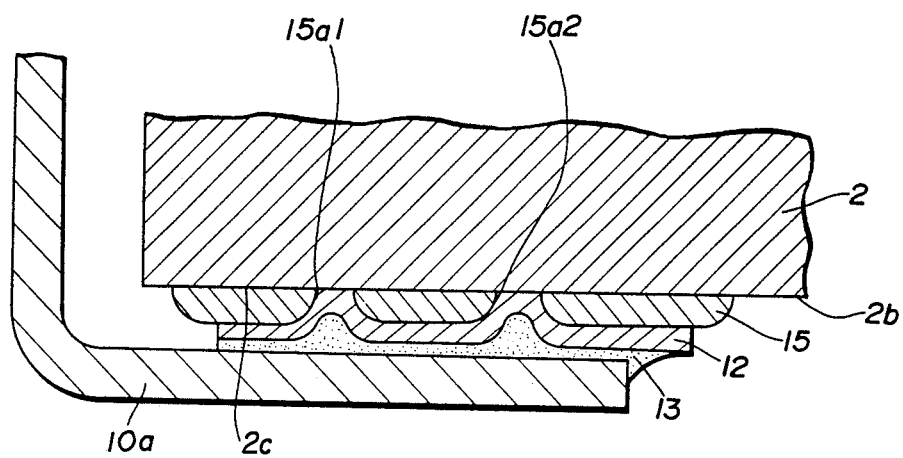
FIG. 7 is an enlarged cross sectional view showing the essential parts of another embodiment of the module sealing structure according to the present invention.

Another embodiment of the module sealing structure according to the present invention is illustrated in FIG. 7. In FIG. 7, the parts which are the same as those corresponding parts in FIGS. 3 through 5 are designated by the same reference numerals, and description thereof is omitted. In this embodiment, two grooves 15a1 and 15a2 are formed in the polyimide layer 15 to provide a more positive moisture seal. According to this embodiment, the adhesion area of the solder 13 is increased thereby improving the strength at the junction between the substrate 2 and the flange 10a of the metal fitting 10. It is of course possible to provide more than two grooves 15a in the polyimide layer 15.

The substrate 2 is not limited to the multi-layer ceramic substrate, and other substrates such as glass ceramic substrates may be used.

Further, the present invention is not limited to these embodiments, but various variations and modifications may be made without departing from the scope of the present invention.

What is claimed is:

1. A sealed module comprising:
   a cold plate having a passage through which a cooling medium flows;
   bellows structure attached to said cold plate and having a first end which communicates with the passage in said cold plate, said cold plate and said bellows structure forming a thermal conduction type cooling system;
   a plated printed circuit having a substrate and an integrated circuit element provided on a first surface of the substrate, said integrated circuit element being in contact with a second end of said bellow structure;
   a metal fitting secured on said cold plate and having a flange disposed beneath a second surface of the substrate to present a junction between the second surface of the substrate and the flange of said metal fitting;
   a polyimide layer formed on the second surface of the substrate;
   a conductor layer formed on the polyimide layer, said polyimide layer and said conductor layer being in the peripheral portion of the second surface of said substrate; and
   solder means fixing the flange of said metal fitting to said conductor layer.

2. A sealed module as set forth in claim 1 wherein said polyimide layer has at least one groove, said conductor layer projecting into the groove to make direct contact with the second surface of said substrate at the groove.

3. A sealed module as set forth in claim 1 wherein the space between the cold plate and the substrate is sealed by nitrogen or helium gas.

4. A sealed module as set forth in claim 1 wherein said substrate has circuit patterns formed on the second surface thereof, said conductor layer being made of a metal that is the same as the metal constituting the circuit patterns.

5. A sealed module as set forth in claim 4 wherein an insulator layer is formed on said circuit patterns, said insulator layer being constituted of the same material as said polyimide layer.

6. A sealed module as set forth in claim 5 wherein said insulator layer having holes therein, said substrate further having an input/output pattern formed on said insulator layer and input/output pins which connect to said circuit pattern through said holes.

7. A sealed module as set forth in claim 1 wherein said substrate is made of a ceramic.

8. A sealed module as set forth in claim 1 wherein said substrate is a multi-layer ceramic substrate.

9. A sealed module as set forth in claim 1 wherein said substrate is a glass ceramic substrate.

10. A sealed module as set forth in claim 1 wherein said metal fitting has a generally rectangular ring shape in correspondence with the shape of said substrate.

* * * * *

UNITED STATES PATENT AND TRADEMARK OFFICE
CERTIFICATE OF CORRECTION

PATENT NO. : 4,949,219

DATED : August 14, 1990

INVENTOR(S) : KIYOKAZU MORIIZUMI, KYOICHIRO KAWANO and KIYOTAKA SEYAMA

It is certified that error appears in the above-identified patent and that said Letters Patent is hereby corrected as shown below:

Column 1, line 58, after "2" insert --as shown in FIGS. 1 and 2--.

Column 3, line 1, "a" should be --an enlarged--;

line 26, "those" should be --the---;

line 38, "ringshaped" should be --ring-shaped--.

Signed and Sealed this

Fourteenth Day of January, 1992

Attest:

HARRY F. MANBECK, JR.

*Attesting Officer*     *Commissioner of Patents and Trademarks*